(12) United States Patent
Oh et al.

(10) Patent No.: US 7,893,355 B2
(45) Date of Patent: Feb. 22, 2011

(54) LEAD PIN FOR PACKAGE BOARDS

(75) Inventors: Hueng Jae Oh, Suwon-si (KR); Jin Won Choi, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 120 days.

(21) Appl. No.: 12/232,316

(22) Filed: Sep. 15, 2008

(65) Prior Publication Data

US 2010/0000761 A1    Jan. 7, 2010

(30) Foreign Application Priority Data

Jul. 3, 2008   (KR) ................ 10-2008-0064245

(51) Int. Cl.
*H01R 4/18*    (2006.01)
(52) U.S. Cl. .................................... 174/94 R

(58) Field of Classification Search ............... 174/94 R, 174/267; 439/83
See application file for complete search history.

(56) References Cited

U.S. PATENT DOCUMENTS 7,485,017 B2 *  2/2009  Pang et al. ................ 439/876

FOREIGN PATENT DOCUMENTS

| JP | 2001-177038 | * | 6/2001 |
| JP | 2006-121034 | * | 5/2006 |
| JP | 2006-344621 |   | 12/2006 |
| KR | 10-2007-0068345 |   | 6/2007 |

* cited by examiner

*Primary Examiner*—Chau N Nguyen

(57) ABSTRACT

Provided is a lead pin for package boards including a disk-shaped head of which the diameter increases toward the middle portion thereof and that has a hexagonal vertical cross-sectional shape; and a connection pin that is formed so as to project from the center of the upper surface of the head.

5 Claims, 6 Drawing Sheets

[FIG. 1]
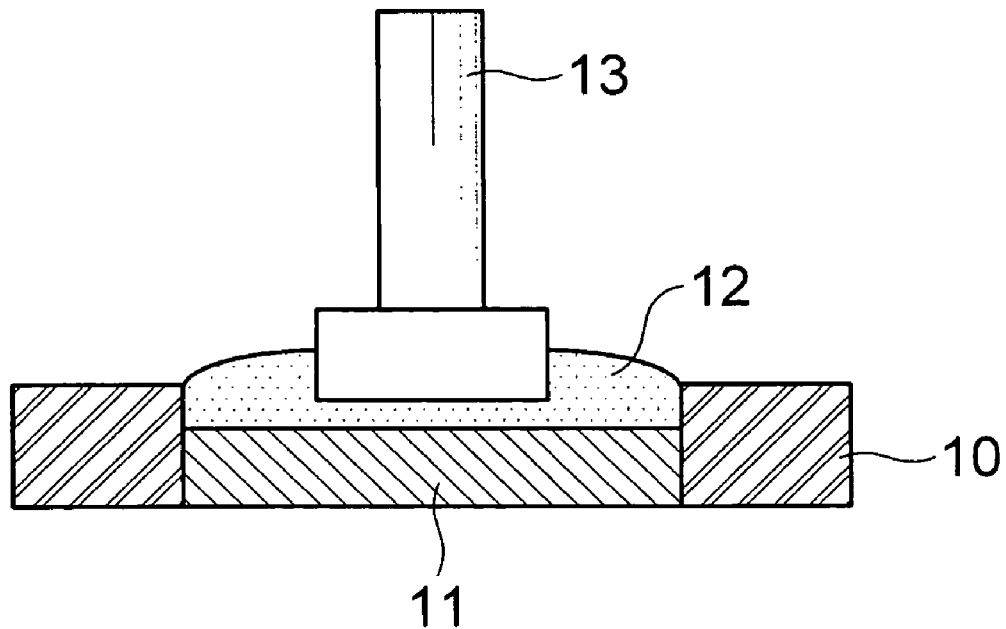
- Prior Art -
[FIG. 2]
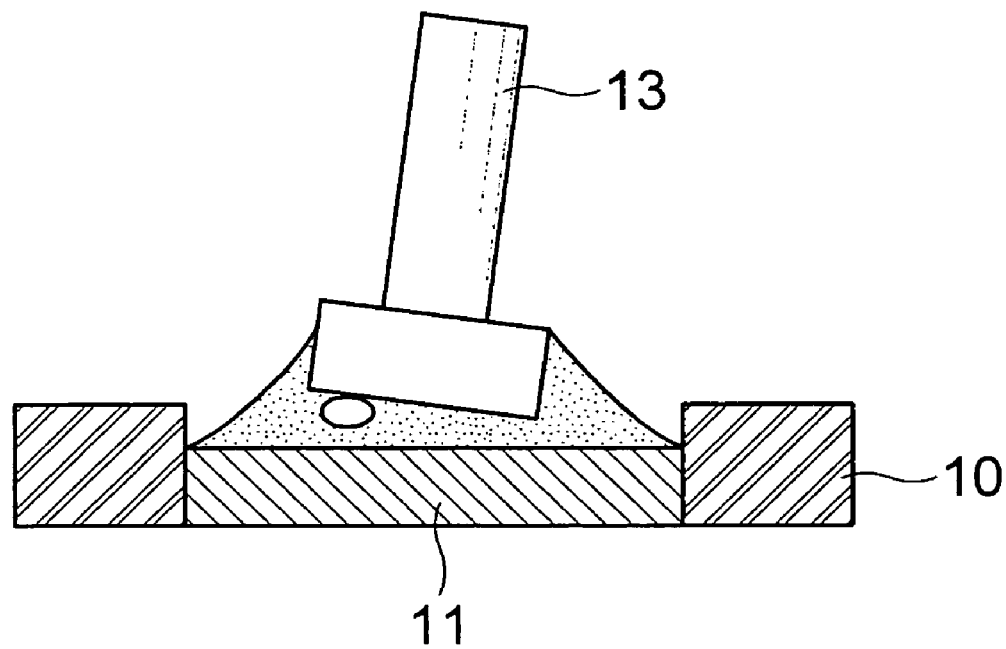
- Prior Art -

[FIG. 3]
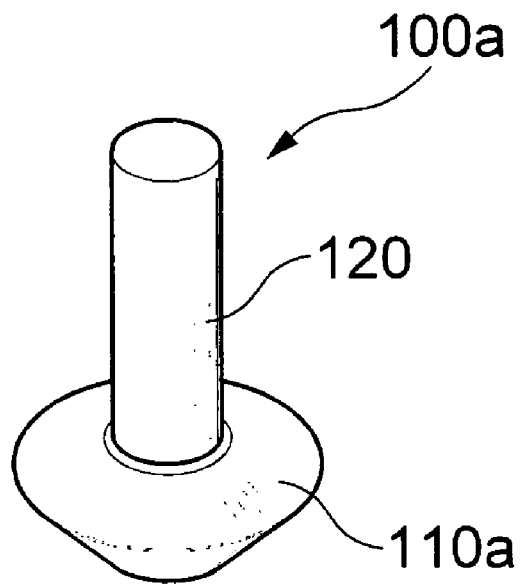
[FIG. 4]
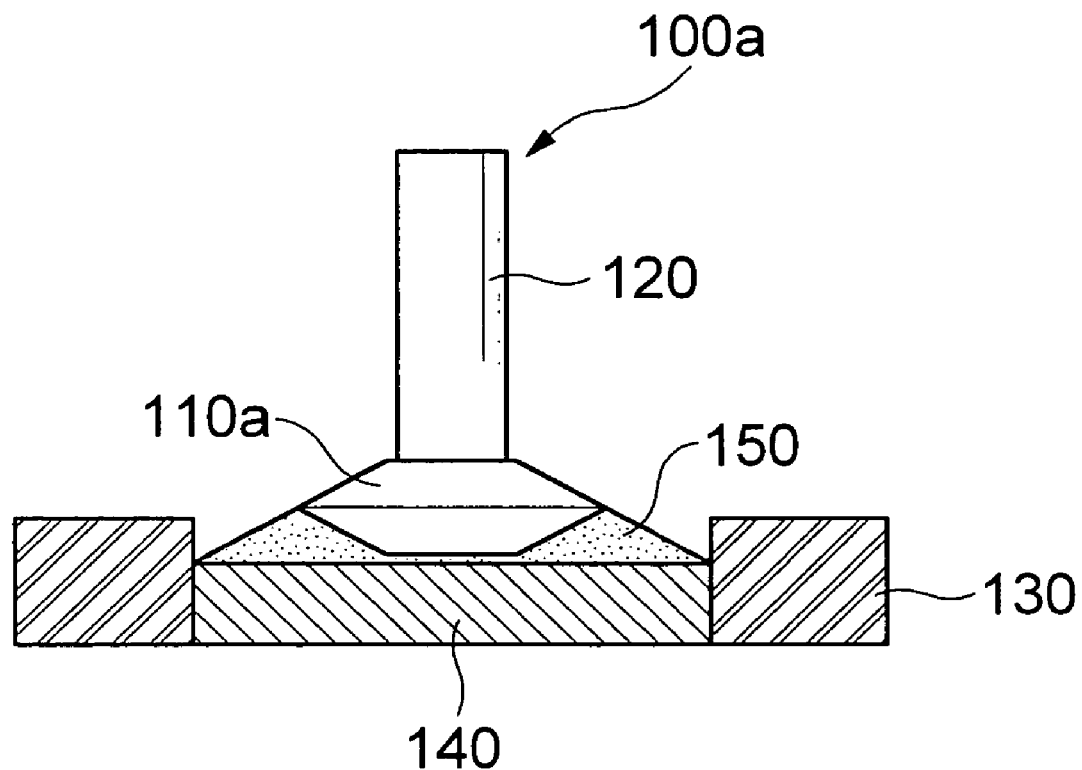

[FIG. 5A]
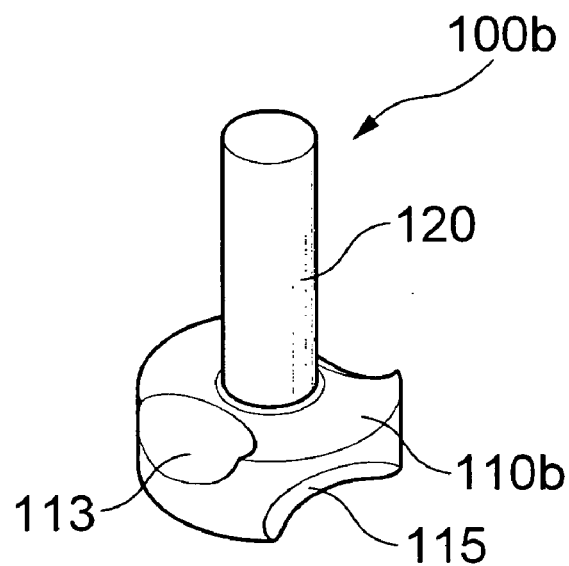
[FIG. 5B]
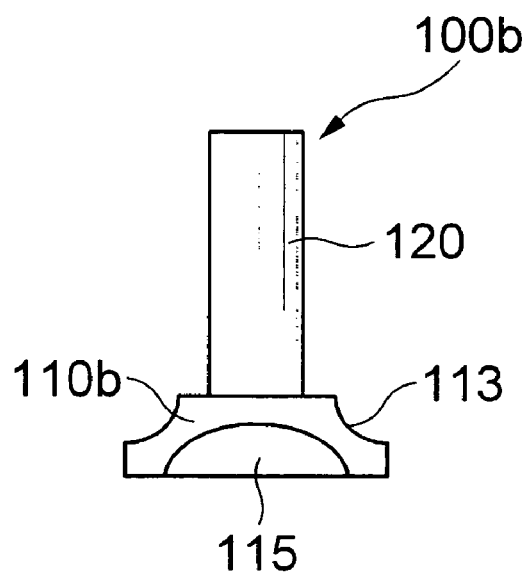
[FIG. 5C]
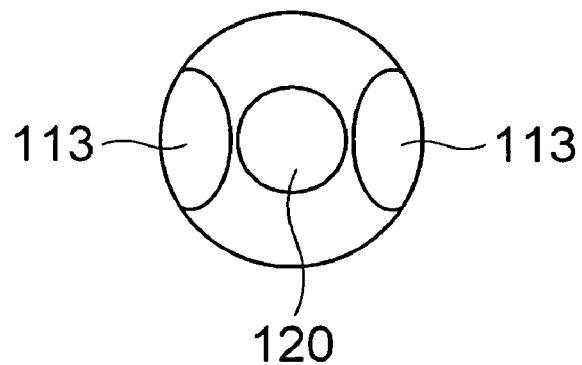

[FIG. 5D]
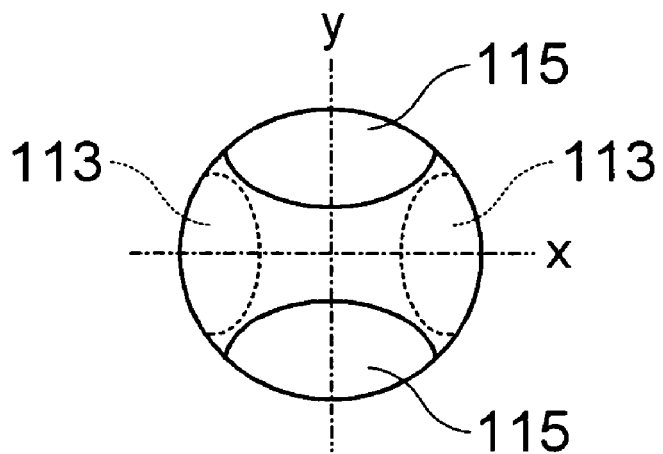
[FIG. 6]
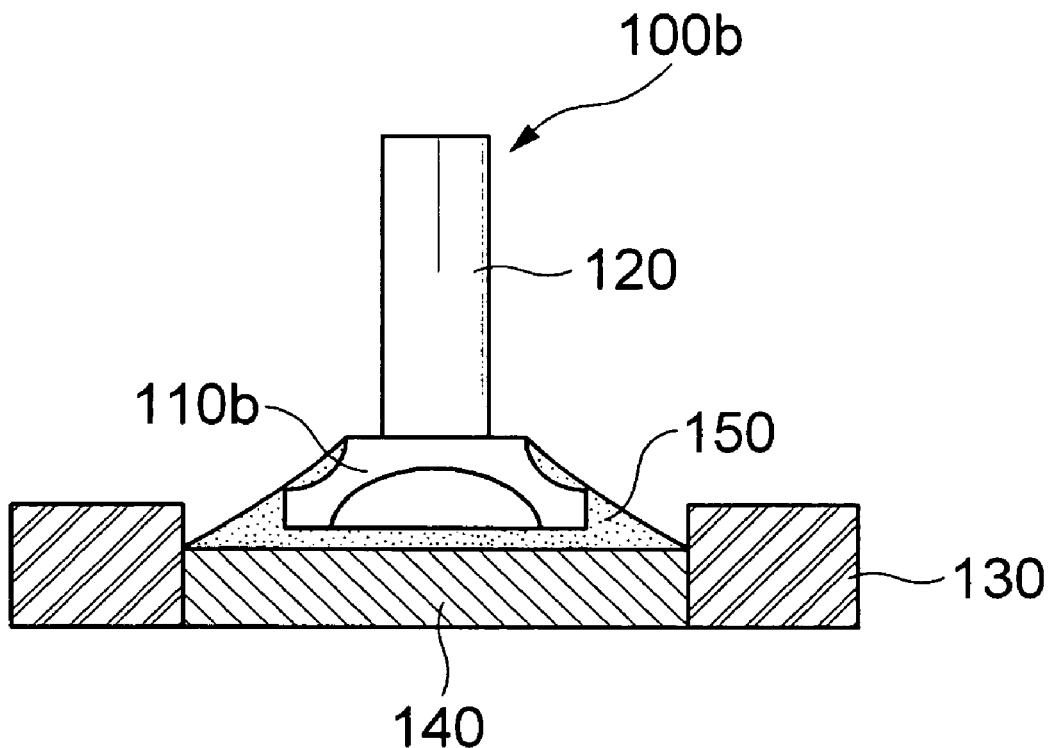

[FIG. 7A]
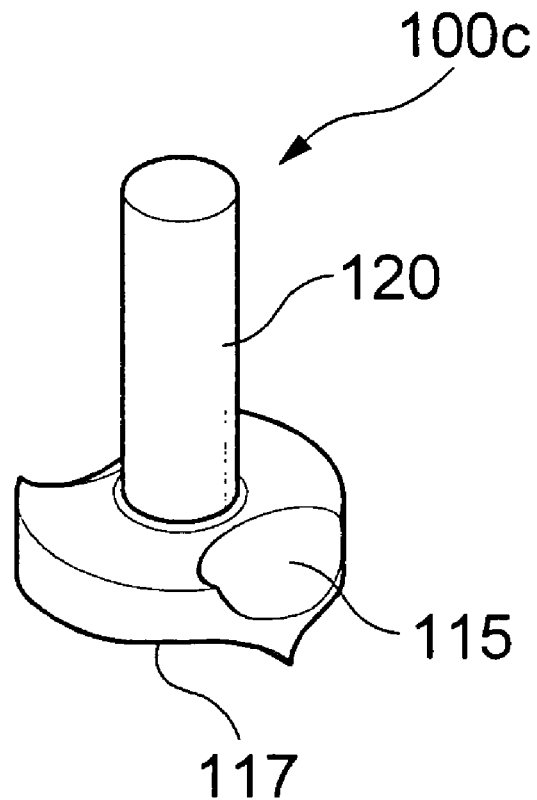
[FIG. 7B]
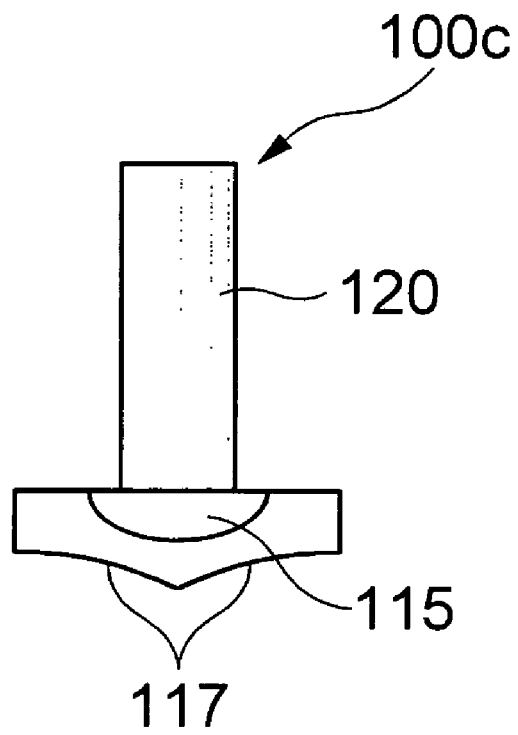

[FIG. 7C]
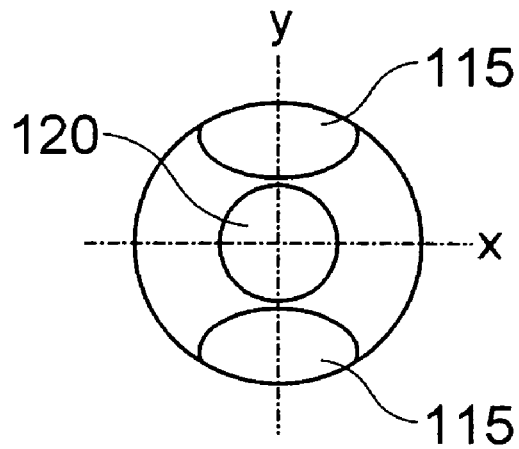
[FIG. 7D]
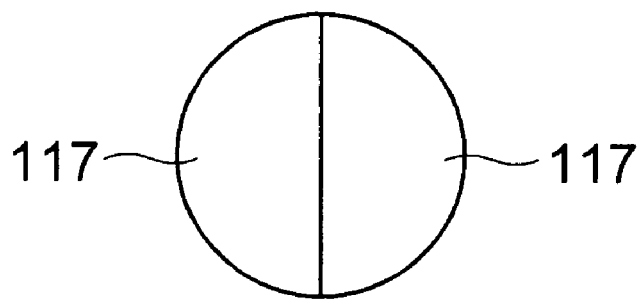
[FIG. 8]
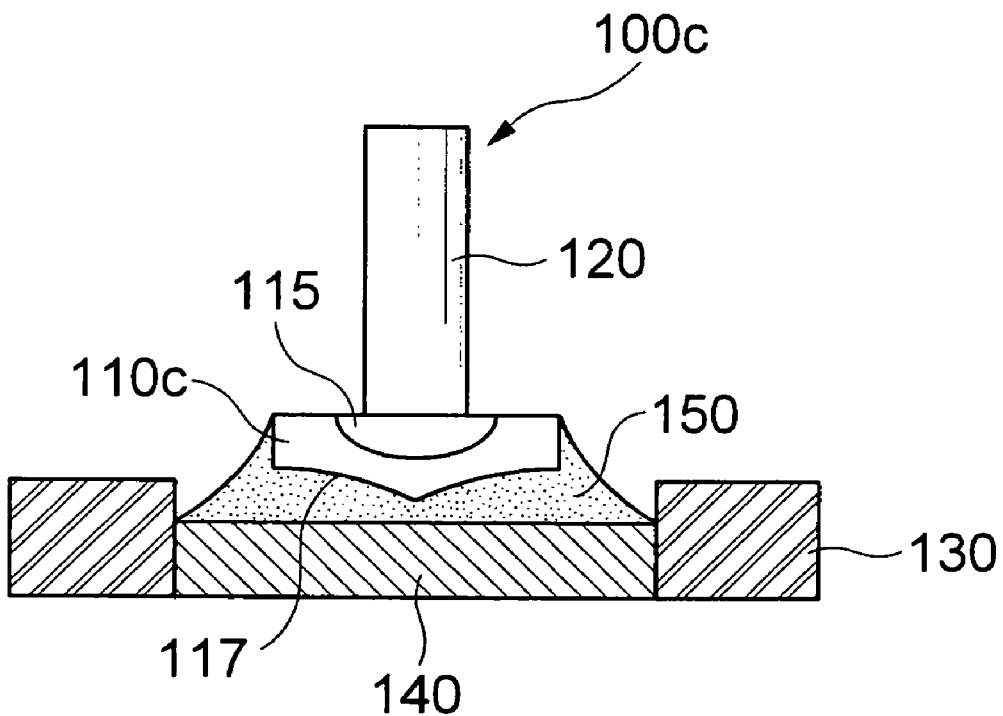

LEAD PIN FOR PACKAGE BOARDS

CROSS-REFERENCE TO RELATED APPLICATIONS

This application claims the benefit of Korean Patent Application No. 10-2008-0064245 filed with the Korea Intellectual Property Office on Jul. 3, 2008, the disclosure of which is incorporated herein by reference.

BACKGROUND OF THE INVENTION

1. Field of the Invention

The present invention relates to a lead pin for package boards.

2. Description of the Related Art

Recently, a PGA (Pin Grid Array)-type semiconductor package board has been widely used for connecting a package board to a main board, the package board having an IC connected thereto. In the PGA-type semiconductor package board, a lead pin is bonded to a pad portion of the package board through solder.

FIGS. 1 and 2 are process diagrams showing a state where a general package board and a lead pin are bonded to each other.

Referring to FIGS. 1 and 2, solder paste 12 obtained by mixing solder and flux is applied on a pad portion 11 of a package board 10, and a lead pin 13 is mounted on the pad portion 11 of the package board 10.

In this case, however, when the lead pin 13 is mounted, buoyancy may occur because an amount and state of the solder paste 12 applied on the pad portion 11 of the package board 10 is not uniform. Then, the position of the lead pin 13 may deviate, thereby degrading the bonding strength between the package board 10 and the lead pin 13.

Next, the lead pin 13 mounted on the pad portion 11 of the package board 10 is bonded to the package board 10 through a reflow process.

The lead pin 13 is bonded to the pad portion 11 of the package board 10 by using solder having a higher melting point than solder used for bonding IC chips.

In this case, however, the melting time of the solder should be maintained for a short period of time, in order to minimize thermal shock applied to the package board 10. Then, a void may occur in the solder, because the time is not enough for the void to escape.

The void formed in such a manner may deteriorate the lead pin 13 while being heated during the mounting of the IC chips, even through the void does not causes defects during the bonding of the lead pin 13.

SUMMARY OF THE INVENTION

An advantage of the present invention is that it provides a lead pin for package boards, which includes a disk-shaped head having a hexagonal vertical cross-section or a cylindrical head having a plurality of grooves formed on the upper and lower surfaces thereof and a connection pin projecting from the center of the upper surface of the head.

Additional aspect and advantages of the present general inventive concept will be set forth in part in the description which follows and, in part, will be obvious from the description, or may be learned by practice of the general inventive concept.

According to an aspect of the invention, a lead pin for package boards comprises a disk-shaped head of which the diameter increases toward the middle portion thereof and that has a hexagonal vertical cross-sectional shape; and a connection pin that is formed so as to project from the center of the upper surface of the head.

The middle portion of the head may be formed to have a larger diameter than the upper and lower surfaces of the head.

The middle portion of the head may be formed to have a larger diameter than the connection pin.

According to another aspect of the invention, a lead pin for package board comprises a cylindrical head having a plurality of grooves formed on the upper and lower surfaces thereof, respectively; and a connection pin projecting from the center of the upper surface of the head.

The grooves formed on the head may have a semi-circular shape.

The grooves formed on the head may be symmetrical with respect to the connection pin.

The grooves formed on the upper and lower surfaces of the head may be symmetrical on x and y lines.

The grooves formed on the lower surface of the head may be spaced at a predetermined distance from an x line so as to be opened outward.

The grooves formed on the lower surface of the head may be formed so as to border each other by reference to a y line.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1 and 2 are process diagrams showing a state where a general package board and a lead pin are bonded to each other;

FIG. 3 is a perspective view of a lead pin for package boards according to a first embodiment of the invention;

FIG. 4 is a cross-sectional view of the lead pin of FIG. 3, showing a state where the lead pin is bonded to a package board;

FIGS. 5A to 5D are perspective views of a lead pin for package boards according to a second embodiment of the invention;

FIG. 6 is a cross-sectional view of the lead pin of FIG. 5A, showing a state where the lead pin is bonded to a package board;

FIGS. 7A to 7D are perspective views of a lead pin for package boards according to a third embodiment of the invention; and FIG. 8 is a cross-sectional view of the lead pin of FIG. 7A, showing a state where the lead pin is bonded to a package board.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a lead pin for package board according to an embodiment of the present invention will be described in detail with reference to the accompanying drawings.

FIG. 3 is a perspective view of a lead pin for package boards according to a first embodiment of the invention. FIG.

4 is a cross-sectional view of the lead pin of FIG. 3, showing a state where the lead pin is bonded to a package board.

Referring FIGS. 3 and 4, the lead pin 100a includes a connection pin 120 and a head 110a having a larger diameter than the connection pin 120.

The head 110a has a hexagonal vertical cross-section. The middle portion of the head 110a has a larger diameter than the upper and lower surfaces thereof and the connection pin 120.

The connection pin 120 is formed so as to project from the center of the upper surface of the head 110a. The height of the connection pin 120 is set to a predetermined value depending on circuit components.

The lead pin 110a constructed in such a manner is mounted on a package board 130 having an electrode pad portion 140 formed on one surface thereof and a wiring pattern (not shown) formed on the other surface thereof. The electrode pad portion 140 is depressed at a predetermined depth and has solder paste 150 printed on the top surface thereof. The wiring pattern has circuit components mounted thereon.

The electrode pad portion 140 serves to electrically connect the wiring pattern of the package board 130 to the circuit components.

The solder paste 150 printed on the electrode pad portion 140 is composed of brown solder balls with viscosity and a resin lump. The solder is formed of an alloy of Pb, Zn, and Ag.

Next, the lead pin 110a is bonded and fixed to the package board 130 through a reflow process where the solder paste 150 printed on the electrode pad portion 140 of the package board 130 is molten through a heat treatment.

In the related art, when the reflow process is performed, a void may expand in the solder paste 150, while the solder paste 150 is molten.

In this embodiment, however, since the void expanding during the reflow process escapes laterally along the inclined upper and lower surfaces of the lead pin 100a, the lead pin 100a is prevented from being tilted or coming off due to the void.

In this embodiment, a deflux process (not shown) for cleaning the bonded portion between the package board 130 and the lead pin 100a may be included.

The reason why the deflux process is performed is as follows. When the surface of the package board 130 is exposed to the air or oxidized, the surface reacts with moisture in the air so as to absorb hydrogen. Then, the bonding may be degraded. Further, when the solder paste 150 applied to the electrode pad portion 140 of the package board 130 comes in contact with moisture in the air, the solder paste 150 may corrode the bonded portion between the electrode pad portion 140 of the package board 130 and the lead pin 100a, while being tinged with white.

FIGS. 5A to 5D are perspective views of a lead pin for package boards according to a second embodiment of the invention. FIG. 6 is a cross-sectional view of the lead pin of FIG. 5A, showing a state where the lead pin is bonded to a package board.

Referring to FIGS. 5A to 5D and 6, the lead pin 100b includes a connection pin 120 and a cylindrical head 110b having grooves 113 and 115 formed in the upper and lower portions thereof, respectively.

The grooves 113 and 115 formed in the upper and lower portions of the head 110b have a semi-circular shape. The grooves 113 formed in the upper portion of the head 110b are symmetrical with respect to the connection pin 120, and the grooves 115 formed in the lower portion of the head 110b are symmetrical with respect to the connection pin 120.

In this case, two or more grooves 113 and two or more grooves 115 may be formed in the upper and lower portions of the head 110b, respectively. As shown in FIG. 5D, it is preferable that the grooves 113 and 115 are formed to be symmetrical on x and y lines, respectively.

The grooves 115 formed in the lower portion of the head 110b are spaced at a predetermined distance from the x line so as to be opened outward.

The lead pin 110b is bonded to the package board 130 constructed as shown in FIG. 4. In the following descriptions, like reference numerals will be attached to the same components as those shown in FIG. 4, and the duplicated descriptions thereof will be omitted.

The lead pin 100b formed in the above-described manner is mounted on the package board 130 and is then bonded and fixed through a reflow process.

At this time, since the grooves 113 and 115 of the lead pin are vertically arranged, the solder paste 150 molten during the reflow process gradually ascends along the grooves so as to be uniformly applied. Therefore, the bonding strength increases.

Further, a void expanding during the reflow process escapes laterally along the grooves 113 and 115. Therefore, the lead pin 100b is prevented from being tilted or coming off due to the void.

FIGS. 7A to 7D are perspective views of a lead pin for package boards according to a third embodiment of the invention. FIG. 8 is a cross-sectional view of the lead pin of FIG. 7A, showing a state where the lead pin is bonded to a package board.

Referring to FIGS. 7A to 7D and 8, the lead pin 100c includes a connection pin 120 and a cylindrical head 110c having grooves 115 and 117 formed on the upper and lower surfaces thereof, respectively.

The grooves 115 and 117 formed on the upper and lower surfaces of the head 110c have a semi-circular shape. The grooves 115 formed on the upper surface of the head 110c are symmetrical with respect to the connection pin 120, and the grooves 117 formed on the lower surface of the head 110c are symmetrical with respect to the connection pin 120.

In this case, two or more grooves 115 and two or more grooves 117 may be formed on the upper and lower surfaces of the head 110c, respectively. As shown in FIG. 7C, it is preferable that the grooves 115 are formed to be symmetrical on x and y lines.

The grooves 117 formed on the lower surface of the head border each other by reference to the y line.

The lead pin 100c has almost the same structure as that of the lead pin 100b shown in FIG. 5A, but is different from the lead pin 100b only in that the grooves 117 formed on the lower surface of the lead pin 100c have a different shape from the grooves 115 formed in the lower portion of the lead pin 100b. The lead pin 100c is bonded to the package board 130 constructed as shown in FIG. 4. In following descriptions, like reference numerals will be attached to the same components as those shown in FIG. 4, and the duplicated descriptions thereof will be omitted.

The lead pin 100c constructed in such a manner is mounted on the package board 130 and is then bonded and fixed through a reflow process.

At this time, the grooves 117 formed on the lower surface of the lead pin 100c are formed so as to border each other. Therefore, as an application area where the head 110c is covered by the solder paste 150 molten during the reflow process increases, the bonding strength increases. Further, a void expanding during the reflow process escapes laterally along the grooves 115 and 117. Therefore, the lead pin 100b is prevented from being tilted or coming off due to the void.

As described above, the lead pin according to the present invention includes the disk-shaped head of which the diameter increases toward the middle portion thereof or the head having a plurality of grooves formed on the upper and lower surfaces thereof, and the connection pin projecting from the center of the upper surface of the head. Therefore, a void is prevented from being formed between the package board and the electrode pad portion, which makes it possible to increase the bonding strength. Accordingly, the quality and yield of the package board significantly increases.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A lead pin for package board, comprising:
   a cylindrical head having a plurality of grooves formed on the upper and lower surfaces thereof, respectively; and
   a connection pin projecting from the center of the upper surface of the head,
   wherein the grooves formed on the lower surface of the head are formed so as to border each other by reference to a y line.

2. The lead pin according to claim 1, wherein the grooves formed on the head have a semi-circular shape.

3. The lead pin according to claim 1, wherein the grooves formed on the head are symmetrical with respect to the connection pin.

4. The lead pin according to claim 1, wherein the grooves formed on the upper and lower surfaces of the head are symmetrical on x and y lines.

5. The lead pin according to claim 1, wherein the grooves formed on the lower surface of the head are spaced at a predetermined distance from an x line so as to be opened outward.

* * * * *